(12) United States Patent  
Currie et al.

(10) Patent No.: US 9,048,167 B2
(45) Date of Patent: *Jun. 2, 2015

(54) REACTED CONDUCTIVE GATE ELECTRODES AND METHODS OF MAKING THE SAME

(71) Applicant: Taiwan Semiconductor Manufacturing Company, Ltd., Hsin-Chu (TW)

(72) Inventors: Matthew T. Currie, Brookline, MA (US); Richard Hammond, Cambridge, MA (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/320,065

(22) Filed: Jun. 30, 2014

(65) Prior Publication Data
US 2014/0312389 A1    Oct. 23, 2014

Related U.S. Application Data

(60) Division of application No. 13/342,589, filed on Jan. 3, 2012, now Pat. No. 8,785,315, which is a continuation of application No. 10/944,618, filed on Sep. 17, 2004, now Pat. No. 8,129,821, which is a continuation of application No. 10/179,079, filed on Jun. 25, 2002, now Pat. No. 6,982,474.

(51) Int. Cl.
*H01L 31/0328* (2006.01)
*H01L 29/165* (2006.01)
*H01L 21/28* (2006.01)
*H01L 21/285* (2006.01)
*H01L 29/10* (2006.01)
*H01L 29/66* (2006.01)
*H01L 29/78* (2006.01)

(52) U.S. Cl.
CPC .......... *H01L 29/165* (2013.01); *H01L 21/2807* (2013.01); *H01L 21/28255* (2013.01); *H01L 21/28518* (2013.01); *H01L 29/1054* (2013.01); *H01L 29/665* (2013.01); *H01L 29/6659* (2013.01); *H01L 29/7842* (2013.01)

(58) Field of Classification Search
USPC ............... 257/18–19, 192, 382, 194, 66, 616, 257/216, 172, 583, 597
See application file for complete search history.

(56) References Cited

U.S. PATENT DOCUMENTS 6,982,474 B2 * 1/2006 Currie et al. .................. 257/616
8,129,821 B2 * 3/2012 Currie et al. .................. 257/616

* cited by examiner

*Primary Examiner* — Hoa B Trinh
(74) *Attorney, Agent, or Firm* — Slater & Matsil, L.L.P

(57) ABSTRACT

A semiconductor device and a method for fabricating a semiconductor device involve a semiconductor layer that includes a first material and a second material. The first and second materials can be silicon and germanium. A contact of the device has a portion proximal to the semiconductor layer and a portion distal to the semiconductor layer. The distal portion includes the first material and the second material. A metal layer formed adjacent to the relaxed semiconductor layer and adjacent to the distal portion of the contact is simultaneously reacted with the relaxed semiconductor layer and with the distal portion of the contact to provide metallic contact material.

20 Claims, 6 Drawing Sheets

REACTED CONDUCTIVE GATE ELECTRODES AND METHODS OF MAKING THE SAME

This application is a divisional of U.S. patent application Ser. No. 13/342,589, filed on Jan. 3, 2012, entitled "Reacted Conductive Gate Electrodes and Methods of Making the Same," which is a continuation of U.S. patent application Ser. No. 10/944,618, filed on Sep. 17, 2004, entitled "Reacted Conductive Gate Electrodes," which is a continuation of U.S. patent application Ser. No. 10/179,079, filed Jun. 25, 2002, entitled "Reacted Conductive Gate Electrodes;" the entire disclosures of these applications are incorporated by reference herein.

TECHNICAL FIELD

The invention generally relates to semiconductor devices, and, more particularly, to the fabrication and structure of contacts in transistors.

BACKGROUND INFORMATION

Continuous improvements in the fabrication and design of semiconductor transistors used in integrated circuit devices have permitted ever greater area densities of transistors. Development of materials and processing for interconnects and contacts plays a large role in transistor development.

Materials and processes for forming conductive contacts and interconnects must accommodate, for example, dimensional requirements, processing temperatures, reliability needs and materials compatibility. Traditional aluminum-based interconnects have gradually given way to copper interconnects for fine dimensions; cobalt silicide and other metallic materials are gradually supplanting titanium silicide source and drain contacts and titanium silicide caps on doped polycrystalline silicon gate contacts.

Another avenue for improvement in device performance involves the use of newer types of substrates as replacements for traditional silicon wafers. For example, wafers that have a silicon-germanium (SiGe) layer can provide improved channel layer performance in a strained-silicon layer grown on the SiGe layer.

Mobility enhancements obtained from strained silicon, in combination with source-drain and gate silicidation techniques, provide the opportunity to increase speed, reduce power consumption, and provide the basis of other advances in microelectronics, such as analog and digital device integration.

The use of substrates that include a SiGe layer, however, can increase fabrication complexity relative to that for conventional silicon wafer-based devices. For example, formation of source and drain contacts through reaction of a metal layer, such as titanium or cobalt, with SiGe in the substrate has preferred process conditions that are different from silicide formation with relatively pure silicon.

SUMMARY OF THE INVENTION

The invention involves structures and fabrication methods for semiconductor devices that preferably have semiconductor layers including two materials in both a substrate and in a gate contact. The invention provides simplified processing for semiconductor devices, as well as improved semiconductor device structures that include compound and/or alloyed semiconductors in both contacts and substrates. The invention provides for simultaneous reaction of a metal layer to form reacted material contacts in the substrate and a reacted material upper portion of a gate contact. The metal layer exhibits a similar reaction behavior with the semiconductor layers in both the substrate and in the upper portion of the gate contact due to a similar composition ratio of the two materials in both semiconductor layers.

Preferred embodiments of the invention feature substrates and contacts that include one or more semiconductor alloy layers of silicon and germanium. Preferred embodiments include SiGe layers of similar composition in both a substrate and a contact; conductive portions are formed by simultaneously reacting the SiGe layers in the substrate and the contact with a metal layer. Thus, for example, source and drain contacts in a substrate can be formed simultaneously with formation of a conductive upper (distal) portion of a gate contact having a portion that includes the semiconductor alloy. In this way, some processing steps are rendered unnecessary during basic device fabrication.

Simplified processing can be achieved in part because reaction of a metal layer with the substrate and with a semiconductor layer in a gate contact need not be decoupled to accommodate, for example, SiGe in the substrate and polycrystalline silicon in the gate. Proper material selection provides substrates and gate contacts that have similar or identical silicide formation steps. Other benefits can arise, such as lower temperature processing for silicide formation.

In preferred embodiments, the invention features transistors that include a gate electrode including SiGe in at least an upper portion of a gate contact (i.e., electrode) and a strained-silicon channel layer on a relaxed SiGe layer in a substrate. By having SiGe in an upper portion of a gate electrode, the silicidation of gate and source-drain regions can be performed in a single process. A lower portion of the gate contact can have a different material composition, chosen to provide, for example, a desired electrical property and/or compatibility with a gate dielectric material.

Thus, in a first aspect, the invention features a method for fabricating a semiconductor device. The method includes provision of a semiconductor layer that includes a first material and a second material. The semiconductor layer can be an alloy of two or more materials. The first and second materials can be silicon and germanium.

The semiconductor layer can be or include a relaxed layer. The relaxed layer can be part of a substrate having a portion, adjacent to the relaxed layer, with a lattice spacing mismatched to that of the relaxed layer. For example, the relaxed layer can be grown on intermediate layers that accommodate mismatch to a silicon wafer. As another example, the relaxed layer can reside on an oxide layer.

The method also includes the formation of a contact that has a portion proximal to the relaxed semiconductor layer and a portion distal to the relaxed semiconductor layer. The distal portion includes the first material and the second material. A metal layer is formed adjacent to the relaxed semiconductor layer and adjacent to the distal portion of the contact. The metal layer is simultaneously reacted with the relaxed semiconductor layer and with the distal portion of the contact.

The silicon and germanium of the distal portion of the contact can have an atomic density ratio that is substantially the same as an atomic density ratio of the silicon and germanium of the relaxed semiconductor layer. The proximal portion of the contact can consist essentially of silicon or essentially of germanium. Alternatively the proximal portion can include silicon and germanium; the atomic density ratio of the silicon and germanium of the proximal portion can differ from the atomic density ratio of the silicon and germanium of the distal portion.

In a second aspect, the invention features a semiconductor device. The device includes a substrate that has a reacted conductive layer that comprises silicon, germanium and a metallic material. The metallic material can be, e.g., titanium, nickel or cobalt. The device also includes a contact that has a portion proximal to the substrate and a reacted conductive portion distal to the substrate. The reacted conductive distal portion of the contact includes silicon, germanium and the same metallic material as in the substrate reacted conductive layer. The substrate can further include a strained semiconductor layer, for example, of silicon, adjacent to the contact.

In a third aspect, the invention features a semiconductor device that includes a substrate that has a reacted conductive layer comprising a first material, a second material and a metallic material. The device includes a contact having a portion proximal to the substrate and a reacted conductive portion distal to the substrate, the distal portion comprising the first material, the second material and the metallic material.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DESCRIPTION

Various features of the invention are well suited to application in metal-oxide-semiconductor (MOS) transistors having Si, $Si_{1-x}Ge_x$ and/or Ge layers in and or on a substrate. The invention provides means to avoid separation of metal layer reaction with the substrate and metal layer reaction with a polycrystalline silicon portion of a gate contact. The invention further provides improved gate design in conjunction with the advantages of a substrate that includes a SiGe layer, among other advantages.

The term "MOS" is here used to refer generally to semiconductor devices that include a conductive gate spaced at least by an insulting layer from a semiconducting channel layer. The terms "SiGe" and "$Si_{1-x}Ge_x$" are here used interchangeably to refer to silicon-germanium alloys. The term "silicide" is here used to refer to a reaction product of a metal, silicon, and optionally other components, such as germanium. The term "silicide" is also used, less formally, to refer to the reaction product of a metal with an elemental semiconductor, a compound semiconductor or an alloy semiconductor.

Figure 1:
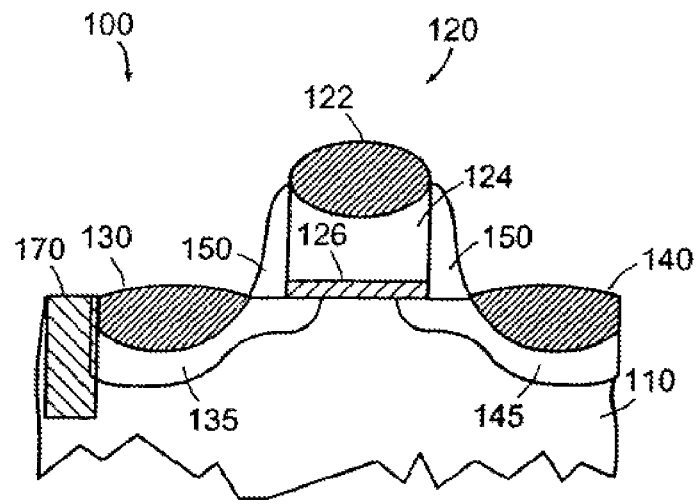
FIG. 1 is a cross-sectional view of a conventional silicon-based MOSFET.

First, with reference to FIG. 1, to provide a context for description of features of the invention, the structure and operation of a conventional MOSFET are described. FIG. 1 is cross-sectional view of a conventional silicon-based MOS field-effect transistor (MOSFET) 100. The transistor 100 includes a gate contact 120, a pair of spacers 150, a source 135, a source silicide contact 130, a gate oxide 126, a drain 145, a drain silicide contact 140 and a silicon substrate 110. The transistor 100 is electrically isolated from neighboring transistors by a shallow trench isolation (STI) portion 170.

The gate contact 120 includes a doped, conductive polycrystalline silicon ("polysilicon") portion 124 proximal to the gate oxide 126 and a distal gate silicide portion 122. The source 135 and drain 145 include doped regions formed by implantation of dopant species into the substrate 110 and annealing, with the spacers 150 controlling the distribution of dopant beneath the gate oxide 126. The silicide contacts 130, 140 and gate silicide portion 122 provide good ohmic interfaces respectively to the source 135 and drain 145 and to the gate polysilicon portion 124.

The MOSFET 100 has a surface channel, which may be defined in physical or electrical terms. Physically, the surface channel is the p-type or n-type silicon that is adjacent to (i.e., below) the gate oxide 126 and which joins the source 135 and drain 145. Electrically, the channel is an inversion layer, which provides current flow between the source 135 and drain 145. Thus, from the electrical point of view, the presence and condition of the channel are variable.

Figure 2:
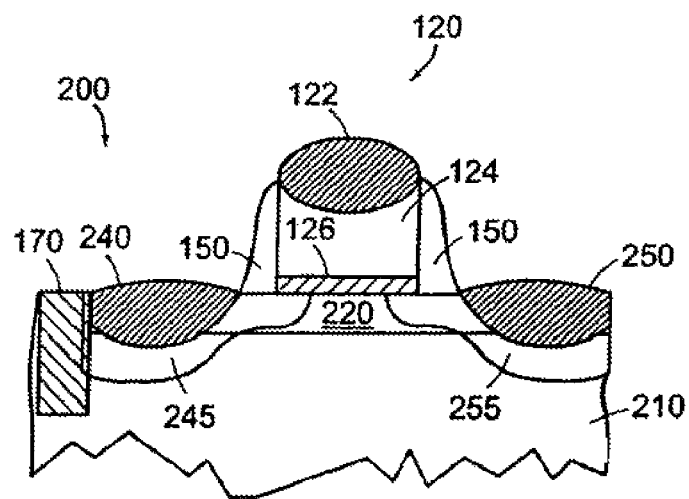
FIG. 2 is a cross-sectional view of an embodiment of a MOSFET that includes a strained-silicon channel layer on a SiGe layer.

FIG. 2 is a cross-sectional view of an embodiment of a MOSFET 200, which is distinguished from the MOSFET 100 of FIG. 1 by the inclusion of a strained-silicon channel layer on a SiGe layer. The following description of the structure of the MOSFET 200 is limited to features that are substantially different from features of the conventional MOSFET 100.

The MOSFET 200 includes a strained-silicon layer 220, a source 245, a drain 255, a source contact 240, a drain contact 250 and a substrate 210 that includes a relaxed SiGe layer (other embodiments include a strained-SiGe layer). The silicon layer 220 can be epitaxially grown on the substrate 210, and provides a surface channel for the MOSFET 200. The source and drain contacts 240, 250 can be formed by reacting a metal layer with portions of the substrate 210 and the silicon layer 220. The source 245 and the drain 255 can be formed by diffusing a dopant into the substrate 210 silicon layer 220. The source and drain contacts 240, 250 can be formed by depositing a metal layer and reacting the metal layer with a portion of the substrate 210, including, at least, portions of the silicon layer 220 and the relaxed SiGe layer.

Figure 3:
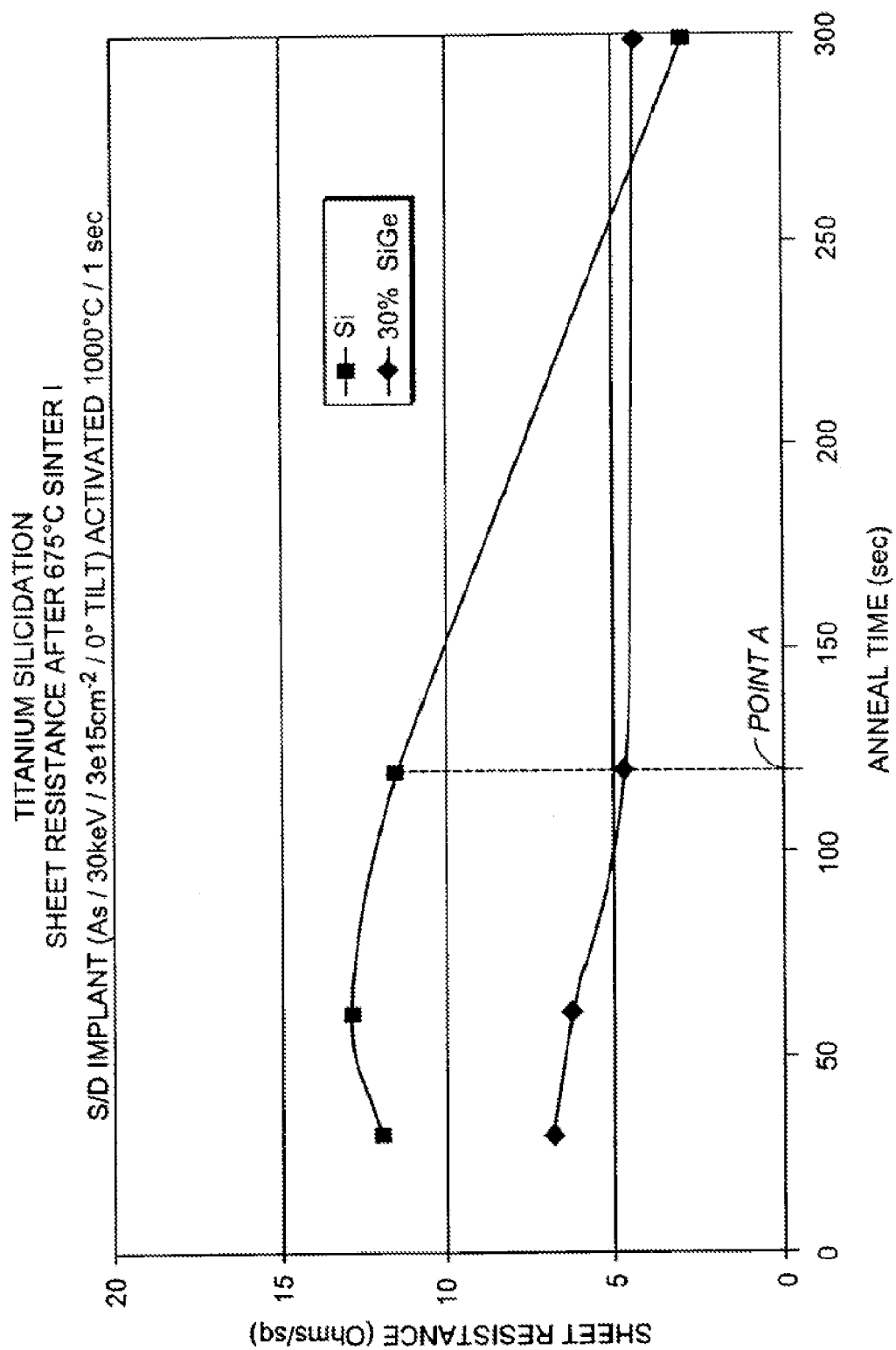
FIG. 3 is a graph of sheet resistance versus anneal time.
Figure 4:
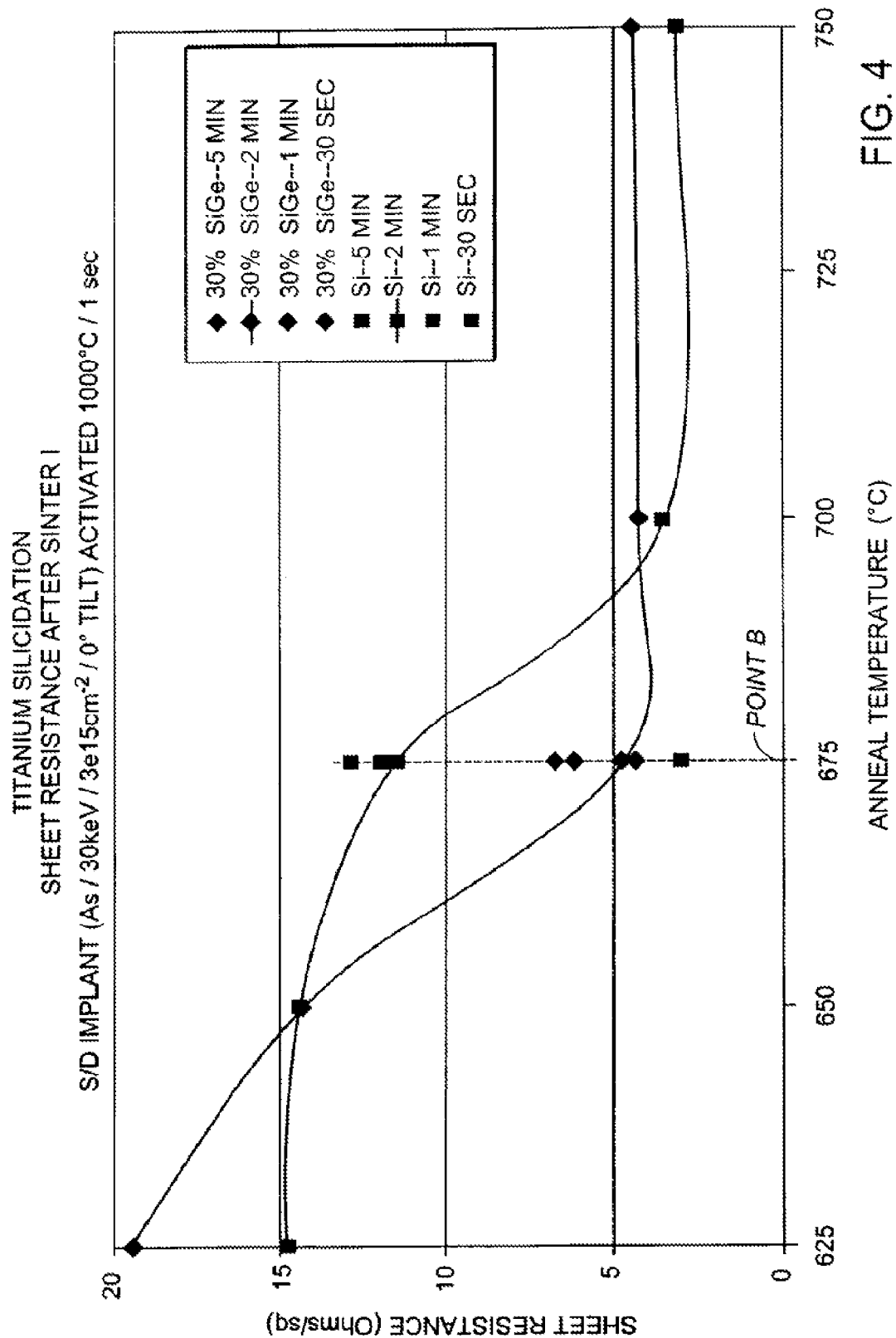
FIG. 4 is a graph of sheet resistance versus anneal temperature.

Referring now to FIGS. 3 and 4, silicidation of silicon and SiGe are compared. Conventional processing methods would typically decouple the formation of the source and drain contacts 240, 250 and the formation of the distal (upper) gate silicide portion 122 due to the differing silicidation behavior of SiGe in the substrate 210 and the polysilicon in the gate contact with a metal layer. As described below, with reference to FIGS. 3 and 4, the silicide formation rate of silicon can be very different from the silicide formation rate of SiGe. While FIGS. 3 and 4 demonstrate differences in silicidation behavior between Si and SiGe after a single annealing step, it should be noted that silicidation processes can utilize multiple annealing steps, oftentimes with unreacted metal being stripped between anneals.

FIG. 3 is a graph showing two curves of the sheet resistance vs. anneal time for samples having a titanium metal layer on Si and on $Si_{0.7}Ge_{0.3}$ during reaction at 675° C. Point A indicates a typically desired interval of anneal time, between 100-150 seconds. At this time, the sheet resistance of the Si sample is more twice that of the $Si_{0.7}Ge_{0.3}$ sample. The sheet resistance of the Si sample eventually drops below that of the $Si_{0.7}Ge_{0.3}$ sample after more than 4 minutes of annealing. This time variable annealing behavior arises from the differing reaction rates for silicide formation for Ti with Si and with SiGe.

FIG. 4 shows a graph of the sheet resistance vs. anneal temperature for samples of the same material combinations as those in FIG. 3. The graph shows data taken at various time intervals, from 30 seconds to 5 minutes. Curves are shown for the sheet resistance vs. temperature after 2 minutes of reaction time.

Point B indicates a desirable anneal temperature of 675° C. The sheet resistance of the reacted Si sample is more twice that of the reacted $Si_{0.7}Ge_{0.3}$ sample for anneal times of approximately 2 minutes or less, again demonstrating the difference in the silicidation rates of Si and SiGe for desirable combinations of annealing time and temperature.

One method for overcoming the differences in silicidation rates of gate and source-drain regions is to decouple the gate silicide formation from the source-drain silicidation, as described in U.S. Pat. No. 4,755,478. The decoupled process for siliciding the source-drain regions and gate electrode regions of a SiGe substrate typically requires more processing steps due to separation of silicidation of polysilicon in a gate contact and silicidation of the source-drain contacts, each set of steps having different optimized conditions. Decoupling tends to increase the costs of the overall silicidation process.

The silicidation of Si can occur at a much higher temperature than silicidation of SiGe. Therefore, an optimized silicidation process involving a polysilicon gate can make the SiGe substrate layer vulnerable to, for example, interdiffusion, dislocation redistribution and silicide agglomeration. Features of the invention can remove a need for decoupling, and provide gate contacts and source/drain contacts with similar, optimized processing conditions. The invention can further provide processing at lower temperatures.

Figure 5:
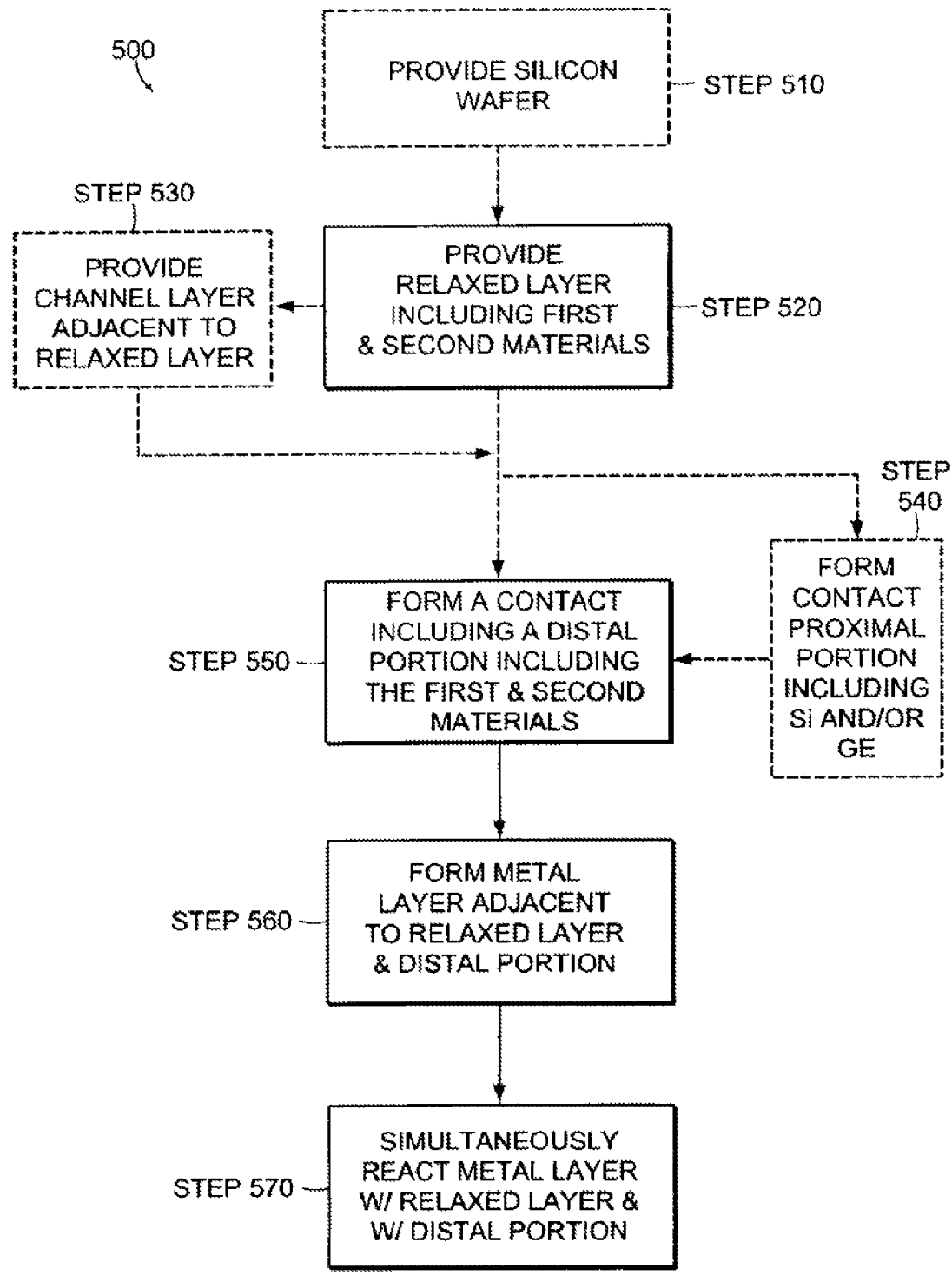
FIG. 5 is a flowchart of an embodiment of a method of fabricating a semiconductor device.

FIG. 5 is a flow diagram of an embodiment of a method 500 for fabricating a semiconductor device, according to principles of the invention. Fabrication can begin with provision of a silicon wafer (Step 510). A relaxed layer is provided (Step 520), and includes first and second materials, for example, silicon and germanium. For example, a substrate that includes a relaxed layer of SiGe, intermediate layers of SiGe and a silicon wafer can be provided; see, e.g., commonly assigned U.S. Pat. No. 6,107,653 to Fitzgerald.

A channel layer, for example, of silicon, can be provided adjacent to the relaxed layer (Step 530). For example, a surface channel silicon layer can be epitaxially grown on a SiGe relaxed layer. In some embodiments, a buried channel layer is provided adjacent to the relaxed layer. Some of these embodiments include one or more buried channel layers and a surface channel layer. The channel layers can include, for example Si, Ge or SiGe. The composition of a channel layer can be chosen in cooperation with the composition of a relaxed layer to provide a desired level of strain in the channel layer, as is conventional in the art.

The method 500 further includes formation of a contact adjacent to the relaxed layer (Step 550). The contact includes a portion that is proximal to the relaxed semiconductor layer and a portion that is distal to the relaxed semiconductor layer, i.e., lower and upper portions. The distal portion includes the first material and the second material, and preferably has substantially the same composition as the relaxed semiconductor layer. Similar compositions, for example, of SiGe, in the relaxed layer and in the upper portion of the contact enable similar optimized processing conditions for reaction of a metal layer with the relaxed layer and with the upper portion of the contact. Thus, reaction of a metal layer can proceed simultaneously for the substrate and for the contact.

Formation of the contact can commence with formation of a lower portion that includes Si, Ge or SiGe (Step 540). The distal portion can then be formed from SiGe having a different composition than the semiconductor of the proximal portion. The composition can vary abruptly or smoothly with position in the contact through the proximal and the distal portions. Thus, the composition of the proximal portion can be chosen, for example, for its electrical performance or compatibility with an adjacent gate dielectric, as described in below. The composition of the distal portion, in contrast, can be chosen to provide compatibility with the composition of the relaxed layer.

The method 500 further includes formation of a metal layer adjacent to the relaxed semiconductor layer and the distal portion of the contact (Step 560). The metal can include, for example, titanium, cobalt, nickel, platinum, molybdenum, tungsten and/or zirconium. The metal layer is simultaneously reacted with the substrate and with the distal portion of the contact (Step 570). In preferred embodiments, most of the metal layer that reacts with the substrate will react with the relaxed semiconductor layer, in part because any surface layers will be relatively thin. Thus, in these embodiments, the relaxed layer will dominate over other portions of the substrate in the reaction with the metal layer.

In the case of a substrate that includes a SiGe relaxed semiconductor layer, the above-described method permits the formation of source and drain silicide contacts in a substrate at the same time as formation of a distal germanium silicide portion of a gate contact. Both gate silicide and source and drain silicide can be formed under preferred time and temperature annealing conditions. Thus, rather than decoupling the formation of a conductive cap for the gate contact and formation of source and drain contacts, the invention facilitates simultaneous processing.

Various preferred embodiments of the invention utilize a substrate that includes a SiGe layer. The SiGe layer can be grown on a silicon wafer, and can include more than one layer of alloys of varying composition, thickness and growth conditions. Thus, the substrate can include a SiGe layer or multiple SiGe layers and/or SiGe layers having graded composition. In some embodiments, the SiGe layer includes a relaxed SiGe layer grown on intermediate SiGe layers that accommodate the lattice mismatch with a silicon wafer.

The substrate can include, for example, a silicon wafer, with the SiGe layers grown on the silicon wafer. In this case, an oxide layer can be present between the silicon wafer and the SiGe layer. Other types of wafers can be used as a base for a substrate, e.g., silicon-on-insulator (SOI) wafers, germanium wafers, glass substrates and laminated substrates.

A channel layer can be a surface or a buried layer, and can be formed, for example, from silicon, germanium or a combination of silicon and germanium. For example, a buried channel layer can be a strained silicon layer epitaxially grown on a relaxed SiGe layer. Alternatively, the buried layer, can be germanium or can be SiGe having a composition that is different from the SiGe of the relaxed layer.

For example, the buried channel layer can have a composition of $Si_{1-x}Ge_x$ while the relaxed layer has a composition of $Si_{1-y}Ge_y$. For x>y, the buried SiGe layer is under compressive stress, and thus exhibits a compressive strain. Thus, material combinations can be chosen to provide a p-channel MOSFET, preferably by providing a compressively strained SiGe buried layer, or an n-channel MOSFET, preferable by providing a tensilely strained silicon layer.

Some preferred embodiments of the invention use relaxed SiGe layers grown on silicon substrates. Silicon, germanium and SiGe layers can be grown via known epitaxial growth techniques. Growth of a buried layer of silicon, germanium or SiGe on a SiGe relaxed layer, or SiGe on silicon, enables production of buried layers of controlled stress and dislocation density. Examples of SiGe substrates, in which the Ge content can be up to 100%, include: a relaxed, uniform composition SiGe layer on a graded composition SiGe layer atop a Si substrate; a relaxed, uniform composition SiGe layer directly adjacent to a Si substrate; and a relaxed, uniform composition SiGe layer on an insulating layer like $SiO_2$, adjacent a Si substrate.

Figure 6:
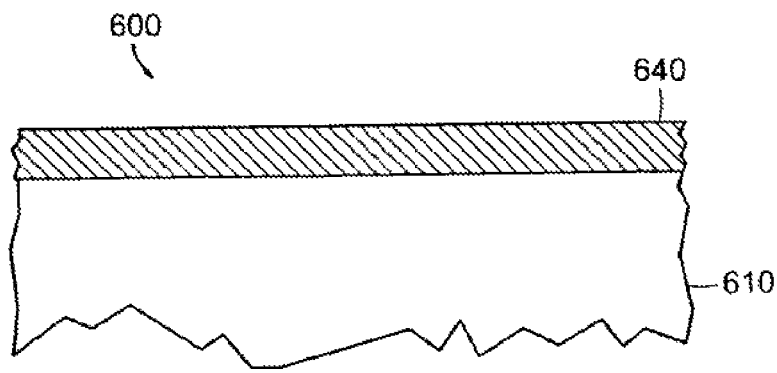
FIG. 6 is a cross-sectional view of an embodiment of a substrate used for fabrication of an embodiment of a MOSFET.
Figure 7A:
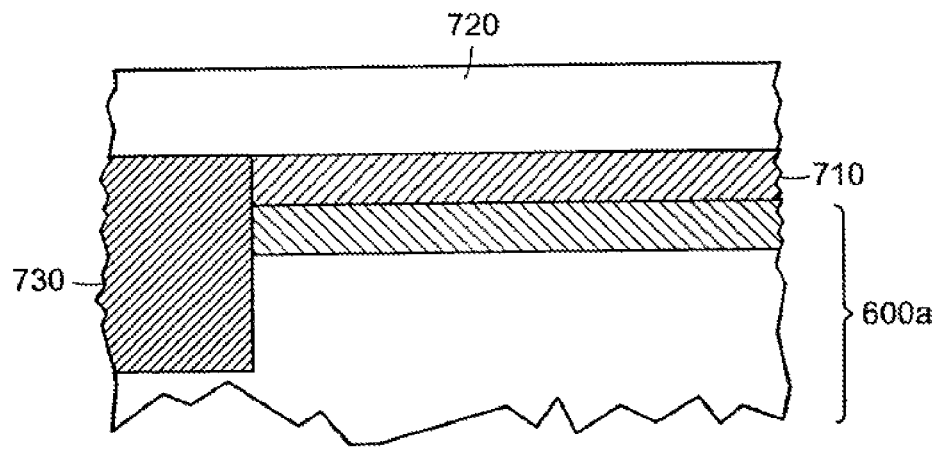
FIGS. 7A and 7B are cross-sectional views of structures at intermediate steps during fabrication of an embodiment of a MOSFET, utilizing the substrate of FIG. 6.
Figure 7B:
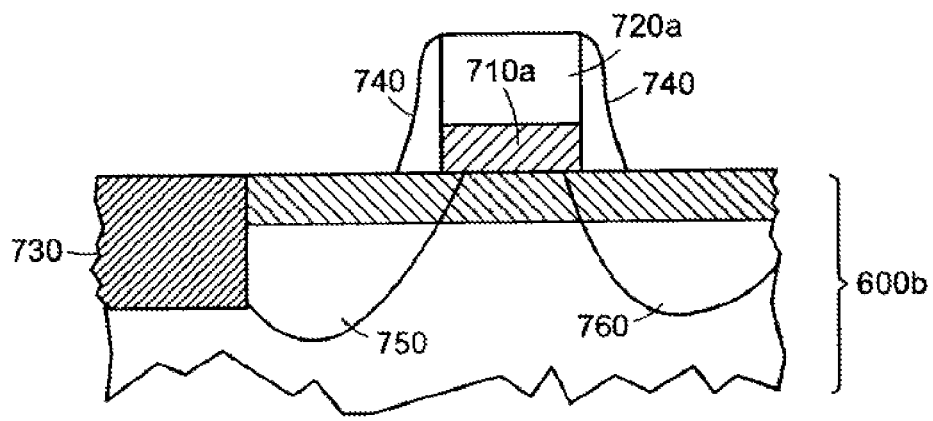
Figure 8A:
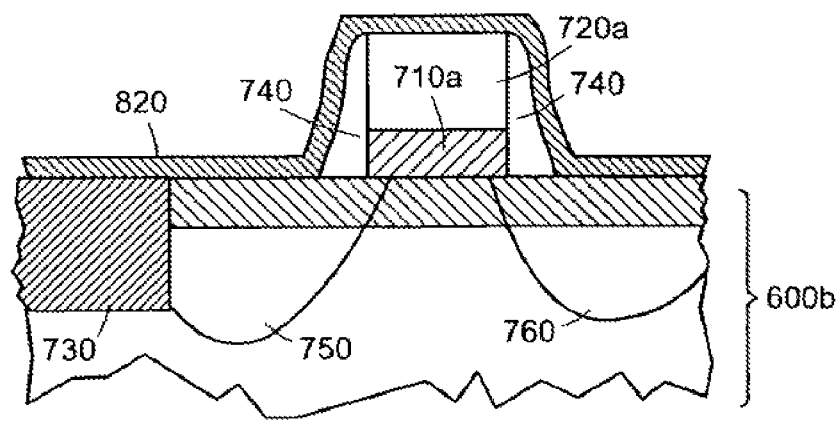
FIGS. 8A and 8B are cross-sectional views of structures at fabrication steps that follow the steps illustrated in FIGS. 7A and 7B.
Figure 8B:
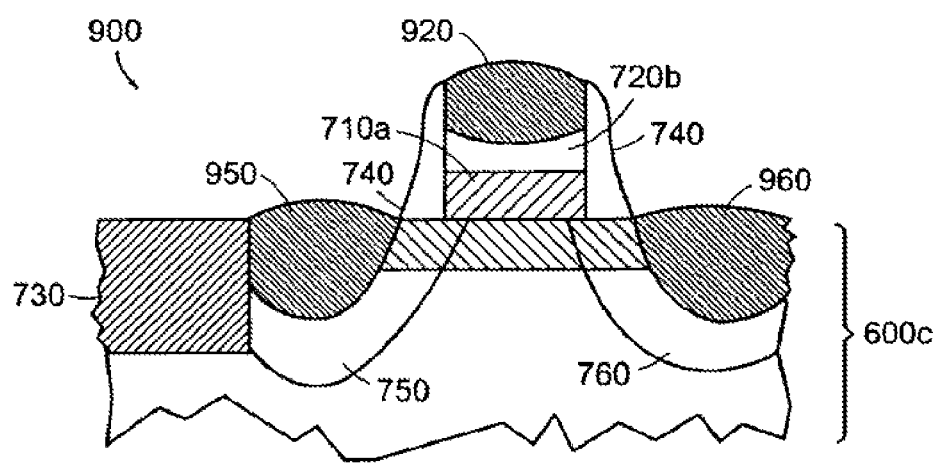

Referring now to FIGS. 6-8, steps in an embodiment of a MOSFET fabrication process, and some preferred device structures, are described. FIGS. 6-8 are chronologically arranged cross-sectional views of MOSFET-related structures at various stages of an embodiment of a MOSFET fabrication process. The completed embodiment of a MOSFET 900 is shown in FIG. 8B.

FIG. 6 illustrates an embodiment of a substrate 600 used as a base for fabrication of the embodiment of the MOSFET 900. The substrate 600 includes a relaxed SiGe layer 610 and a strained Si surface layer 640. The substrate 600 can provide a base for the fabrication of semiconductor devices, such as transistors. The substrate 600 can be manufactured via epitaxial growth and polishing techniques, as described in commonly assigned U.S. Pat. No. 6,107,653 to Fitzgerald.

It will be appreciated by those skilled in the art that the relaxed SiGe substrate layer 610 can form the base substrate of many types of MOSFET devices. The thin strained Si layer 640 can alternatively be a SiGe layer, a sequence of Si and SiGe layers, or other combination of thin epitaxial layers, as described above.

FIGS. 7A-B illustrate some fabrication steps of a gate contact for the MOSFET 900. FIG. 7A shows a cross-sectional view of a device at a stage of fabrication, chronologically following the stage of FIG. 6. At this stage, regions of isolation portions 730 have been formed in the substrate 600 to provide a modified substrate 600a. A dielectric layer 710 and a polycrystalline semiconductor layer 720 have been formed on the substrate 600a. The polycrystalline semiconductor layer 720 can include silicon and germanium.

The isolation portion 730 preferably is deep enough to cross all channel layers of semiconductor material in the substrate 600a, ending at least in the SiGe relaxed layer of the substrate 600a. In other embodiments, the isolation portions 730 are absent or replaced by other isolation means. For example, one embodiment includes semi-recessed oxide isolation (S-ROX) portions. Generally, a relatively high degree of planarity is preferably maintained between the upper surface of the substrate 600a and the upper surface of the isolation portions 730.

The dielectric layer 710, which provides a gate dielectric, is formed on the exposed surface of the substrate 600, possibly consuming a portion of the surface of the strained-silicon layer 640. The dielectric layer 710 can be formed by various methods conventional in the art, e.g., via thermal oxidation of the surface of the substrate 600 or via a deposition technique.

The dielectric layer 710 can be, for example, a 15-100 Å (1.5-10.0 nm) thick layer of silicon dioxide. Other embodiments include other suitable dielectric materials, e.g., silicon oxynitride, silicon nitride, a plurality of silicon nitride and silicon oxide layers, or a high-k dielectric.

A polycrystalline semiconductor layer 720 is then deposited on the dielectric layer 710, e.g., via chemical-vapor deposition. The polycrystalline semiconductor layer 720 can be, for example, 1000 Å (100 nm) thick.

The polycrystalline semiconductor layer 720 preferably has an upper portion including SiGe with a Ge content substantially identical to the Ge content of the relaxed SiGe layer 610. In some embodiments, a proximal (lower) portion of the layer 720 has a different composition from that of the distal (upper) portion of the layer 720. Thus, the composition of the distal portion can be matched to the substrate layer 610, while the portion in contact with the dielectric layer 710 can have a composition chosen, for example, for its compatibility with the dielectric material. For example, polycrystalline silicon is highly compatible with silicon dioxide dielectric, the interface between these two materials has a relatively very low electrical defect density.

FIG. 7B illustrates another stage in the production of the MOSFET 900, related to some steps in the formation of a gate contact. The dielectric layer 710 and the polycrystalline semiconductor layer 720 have been patterned to respectively form a gate dielectric 710a and a gate contact semiconductor portion 720a. The patterning can be performed via methods conventional in the art, e.g., via photolithography and sputter etching.

Contact sidewall spacers 740 have been formed prior to formation of a source region 750, and a drain region 760. The sidewall spacers 740 can provide isolation between the gate contact and source/drain regions 750, 760, and facilitate fabrication of self-aligned structures. The spacers 740 can be formed via methods conventional in the art, e.g., via oxide deposition, thermal oxidation of polysilicon and/or nitride deposition.

The source region 750 and the drain region 760 include dopant, which extends across the interface between the silicon surface layer 640 and the SiGe relaxed layer in the further modified substrate 600b.

For one embodiment of the MOSFET 900, the structures illustrated in FIG. 7B are fabricated as follows. A layer of photosensitive polymer (e.g., a Novolak-based photoresist, as known to one having ordinary skill in the semiconductor lithography arts) is coated on a polycrystalline-SiGe semiconductor layer 720. The polymer is exposed and developed to define a photo-mask having substantially vertical sidewalls. The exposed portions of SiGe semiconductor layer 720 are sequentially etched in a directional mode to define the gate contact semiconductor portion 720a. The photo-mask is removed, e.g., via an $O_2$ plasma etch.

The sidewall spacers 740 are formed on the exposed sides of the gate contact semiconductor portion 720a. The sidewall spacers 740 can be formed using one of several known methods. A preferred method is to deposit a layer of chemically vapor-deposited (CVD) oxide over the entire structure, and directionally etch the deposited layer so that it is removed from the horizontal surfaces of the substrate. During this removal step, exposed portions of the underlying dielectric layer 710 are also removed to define the gate dielectric 710a.

After the sidewall spacers 740 are formed, the source region 750 and the drain region 760 are defined, for example, through ion implantation and drive-in anneal. The diffusion regions can be formed using one of several techniques. For example, implantation of dopant ions to define the diffusion regions can use the gate contact and isolation regions 730 as an implantation mask.

FIG. 8A-B illustrate aspects of silicide formation for the MOSFET 900. FIG. 8A illustrates deposition of a metal layer 820 on the structures illustrated in FIG. 7B. The metal layer 820 is formed during a single deposition step, and is adjacent to portions of both the substrate 600b and the gate contact semiconductor portion 720a. The metal layer 820 preferably is approximately 8-20 nanometers (nm) in thickness.

FIG. 8B is a cross-sectional view of the completed embodiment of the MOSFET 900. Upon annealing of the structures shown in FIG. 8A, and removal of residual portions of the metal layer 820, self-aligned gate and source-drain silicide contacts are formed, as described below; the MOSFET 900 includes a gate contact silicide 920, source contact silicide 950 and a drain contact silicide 960.

The gate contact silicide 920 forms from reaction of a portion of the metal layer 820 with SiGe in the gate contact semiconductor portion 720a. The source and drain contacts 950, 960 form from reaction of a portion of the metal layer 820 with Si and SiGe in the substrate 600b, thus leaving a further modified substrate 600c. The metal layer 820 reacts with SiGe having similar or identical compositions in both the gate contact and in the substrate 600b, providing common silicidation behavior and silicide formation in a single step.

After reaction of the metal layer 820 with neighboring material, an unreacted gate semiconductor portion 720b can remain in the contact. Some metals that can be used in the metal layer 820 are described in the following:

Titanium—can provide a good silicide on SiGe, but generally not well suited to short gate length polysilicon gates.
Cobalt—generally preferable relative to Ti for sub-quarter micrometer linewidths, but can lead to agglomeration problems in conjunction with SiGe having a Ge atomic fraction of greater than approximately 15%.
Nickel—generally works well with SiGe, at least for Ge atomic compositions of up to 45-50% or more, and consumes less silicon during silicidation than some other metals.
Platinum—generally works well with SiGe, at least for Ge atomic compositions of up to 45-50% or more.
Zirconium—can be used with SiGe.
Multilayered metals—stacked metal layers (e.g., Pt/Ni) can be used.
Alloys—can be used (e.g., NiPt).

In one embodiment of the MOSFET 900, the gate contact semiconductor portion 720a includes SiGe with a graded composition. In this embodiment, a distal portion of the gate contact semiconductor portion 720a has a composition that matches the relaxed SiGe layer 610, and a proximal portion, adjacent to the gate dielectric 710a, that has a greater Ge content. The greater Ge content can be substantially pure Ge. This embodiment provides single-step silicidation of source, drain and gate with the further advantage of an improved work function due to the elevated Ge content at the interface with the gate dielectric 710a.

In another embodiment, a proximal portion of the gate contact semiconductor portion 720a is substantially pure silicon. This embodiment provides single-step silicidation of source, drain and gate, as well as a high quality gate contact/gate oxide interface, for example when the gate oxide 710a is a silicon dioxide. It can also provide, for example, a gate contact work function that is similar/identical to conventional MOSFETS.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A semiconductor structure comprising:
    a strained channel region over a relaxed region of a substrate, the relaxed region comprising a first material and a second material;
    a gate contact over the strained channel region, the gate contact having a distal portion and a proximal portion, the distal portion being distal from the strained channel region, the proximal portion being proximate the strained channel region, the distal portion comprising the first material and the second material, a content of the first material and the second material in the distal portion being different from a content of the first material and the second material in the proximal portion; and
    a reacted conductive region on the distal portion, the reacted conductive region comprising the first material and the second material.

2. The semiconductor structure of claim 1, wherein the reacted conductive region further comprises a metal.

3. The semiconductor structure of claim 1 further comprising an additional reacted conductive region on the relaxed region, the additional reacted conductive region comprising the first material and the second material.

4. The semiconductor structure of claim 1, wherein the gate contact comprises a graded composition of the first material and the second material.

5. The semiconductor structure of claim 1, wherein the content of the first material and the second material in the distal portion is equal to a content of the first material and the second material in the relaxed region.

6. The semiconductor structure of claim 1, wherein the first material is silicon, and the second material is germanium.

7. The semiconductor structure of claim 1, wherein the relaxed region comprises a relaxed layer over a graded layer of the substrate.

8. A semiconductor structure comprising:
    a strained layer over a relaxed region, the relaxed region comprising a first material and a second material;
    a gate structure over the strained layer, the gate structure comprising a gate contact, the gate contact comprising a first portion proximate the strained layer and a second portion distal from the strained layer, the second portion comprising the first material and the second material, the gate contact further comprising a first metal reacted with the first material of the second portion and the second material of the second portion; and
    a source/drain contact proximate the gate structure, the source/drain contact comprising a second metal reacted with the first material of the relaxed region and the second material of the relaxed region.

9. The semiconductor structure of claim 8, wherein the gate contact comprises a graded composition of the first material and the second material between the first portion and the second portion.

10. The semiconductor structure of claim 8, wherein the first material is silicon, and the second material is germanium.

11. The semiconductor structure of claim 8, wherein an atomic ratio of the first material and the second material in the relaxed region is substantially the same as an atomic ratio of the first material and the second material in the second portion of the gate contact.

12. The semiconductor structure of claim 8, wherein the first metal reacted with the first material of the second portion and the second material of the second portion is a same composition as the second metal reacted with the first material of the relaxed region and the second material of the relaxed region.

13. The semiconductor structure of claim 8, wherein the first metal and the second metal are a same metal.

14. The semiconductor structure of claim 8, wherein the first metal and the second metal comprise titanium, cobalt, nickel, platinum, zirconium, or a combination thereof.

15. A semiconductor structure comprising:
    a gate structure comprising:
        a dielectric layer, and
        a gate contact over the dielectric layer, the gate contact comprising:
            a first portion proximate the dielectric layer, the first portion being unreacted silicon, and
            a second portion distal from the dielectric layer, the second portion comprising an alloy of silicon and germanium, the second portion comprising a first metal reacted with the alloy of silicon and germanium.

16. The semiconductor structure of claim 15 further comprising a strained layer over a relaxed region of a substrate, the gate structure being over the strained layer.

17. The semiconductor structure of claim 15 further comprising:
    a substrate having a relaxed region comprising a second alloy of silicon and germanium, the gate structure being over the substrate; and
    a source/drain contact proximate the gate structure, the source/drain contact comprising a second metal reacted with the second alloy of silicon and germanium in the relaxed region of the substrate.

18. The semiconductor structure of claim 15 further comprising:
    a substrate comprising:
        a relaxed layer comprising a second alloy of silicon and germanium, and
        a strained layer over the relaxed layer, the gate structure being over the strained layer, the strained layer comprising a strained channel; and
    a source/drain contact proximate the gate structure, the source/drain contact comprising a second metal reacted with the second alloy of silicon and germanium in the relaxed layer of the substrate.

19. The semiconductor structure of claim 15, wherein the gate contact comprises a graded composition of silicon and germanium between the first portion and the second portion.

20. The semiconductor structure of claim 15, wherein the first metal comprises titanium, cobalt, nickel, platinum, zirconium, or a combination thereof.

* * * * *